(12) United States Patent
Ryan et al.

(10) Patent No.: US 7,027,349 B2
(45) Date of Patent: Apr. 11, 2006

(54) METHOD FOR SELECTING MEMORY DEVICE IN RESPONSE TO BANK SELECTION SIGNAL

(75) Inventors: Kevin J. Ryan, Eagle, ID (US); Brent Keeth, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/969,177

(22) Filed: Oct. 21, 2004

(65) Prior Publication Data

US 2005/0083753 A1   Apr. 21, 2005

Related U.S. Application Data

(62) Division of application No. 10/302,964, filed on Nov. 25, 2002, now Pat. No. 6,842,393, which is a division of application No. 09/640,759, filed on Aug. 18, 2000, now Pat. No. 6,535,450.

(51) Int. Cl.
   *G11C 8/00* (2006.01)

(52) U.S. Cl. .................. 365/230.03; 711/105; 711/111

(58) Field of Classification Search .......... 365/230.03, 365/185.11, 230.06, 238.05, 51; 711/105 X, 711/100, 111 X
See application file for complete search history.

(56) References Cited

U.S. PATENT DOCUMENTS

| 4,882,700 | A | 11/1989 | Mauritz et al. |
|---|---|---|---|
| 5,319,755 | A | 6/1994 | Farmwald et al. |
| 5,781,496 | A | 7/1998 | Pinkham et al. |
| 5,841,580 | A | 11/1998 | Farmwald et al. |
| 5,860,080 | A | 1/1999 | James et al. |
| 5,917,760 | A | 6/1999 | Millar |
| 5,953,263 | A | 9/1999 | Farmwald et al. |
| 5,954,804 | A | 9/1999 | Farmwald et al. |
| 6,038,195 | A | 3/2000 | Farmwald et al. |
| 6,041,016 | A | 3/2000 | Freker |
| 6,199,151 | B1 | 3/2001 | Williams et al. |
| 6,338,108 | B1 | 1/2002 | Motomura |
| 6,349,399 | B1 | 2/2002 | Manning |

OTHER PUBLICATIONS

"SLDRAM Architectual and Functional Overview," Gillingham, SLDRAM Consortium, Aug. 29, 1997, pp. 1-14.

*Primary Examiner*—VanThu Nguyen
(74) *Attorney, Agent, or Firm*—Dickstein Shapiro Morin & Oshinsky LLP

(57) ABSTRACT

A method and apparatus is provided for selecting a memory device or a group of memory devices in a memory system using dedicated bank select signals in combination with encoded chip selection signals. A memory controller transmits bank select signals over bank select signal lines and encoded chip select signals on the command and address bus which are used to select an individual memory device or group of memory devices in a bank for an operation.

10 Claims, 11 Drawing Sheets

METHOD FOR SELECTING MEMORY DEVICE IN RESPONSE TO BANK SELECTION SIGNAL

This application is a divisional of application Ser. No. 10/302,964, filed Nov. 25, 2002, now U.S. Pat. No. 6,842,393, which is a divisional of application Ser. No. 09/640,759, filed Aug. 18, 2000, now U.S. Pat. No. 6,535,450 the entire disclosure of each being incorporated herein by reference.

FIELD OF THE INVENTION

The present invention relates to an improved method and apparatus for selecting a single memory device or a group (bank) of memory devices in an integrated circuit memory system.

BACKGROUND OF THE INVENTION

Memory devices are constantly evolving in the directions of faster speed and higher memory density. To this end, dynamic random access memory (DRAM) devices have evolved from simple DRAM devices to EDO to SDRAM to DDR SDRAM to SLDRAM, the latter of which is the subject of much current industry interest. SLDRAM has a high sustainable bandwidth, low latency, low power, user upgradability and support for large hierarchical memory applications. It also provides multiple independent banks, fast read/write bus turn-around, and the capability for small fully pipelined bursts.

An overview of SLDRAM devices can be found in the specification entitled "SLDRAM Architectural and Functional Overview," by Gillingham, 1997 SLDRAM Consortium (Aug. 29, 1997), the disclosure of which is incorporated by reference herein.

Improvements in speed and memory density of SLDRAM and other contemporary memory devices have uncovered limitations in current schemes for addressing a specific memory device or a group of memory devices in a memory system, for example during calibration, testing, or READ and WRITE operations involving a single memory device. Such limitations include degradations in efficiency resulting from unnecessarily high power consumption.

For example, in order for one current memory system to complete an operation, such as a READ or WRITE operation, the memory controller may identify a particular memory device or a group of memory devices with which to perform the operation, encode the identification information in commands, and transmit the commands including the identification information to the device or group of devices. In one prior art system memory system, each individual device is assigned a unique ID code and each command contains an embedded ID code designating the intended recipient device(s) for that command. The memory controller then transmits every command to all devices in the system, and each device is required to capture and decode every command in order to determine whether the current command applies to that device. This scheme results in unnecessary power consumption and consequent loss of efficiency where high-speed data capture circuitry at each device is used to receive and decode commands irrelevant to that device.

Another selection scheme, used by SDRAM systems, does not allow for selection of an individual device but does allow for selection of a group of devices (e.g., all devices on a memory module) using designated chip-select lines connecting the memory controller to each group of devices in the system. Selection is accomplished by transmitting a chip select signal on the chip select lines, concurrently with or immediately before a command is transmitted on the command and address bus, by the memory controller, to each memory module associated with the group of memory devices to be selected. When a memory module receives a chip select signal, all memory devices on that module associated with the selected group capture and decode the command transmitted by the memory controller. For example, if two groups of devices coexist on one module, only those devices in the selected group may capture and decode the command. Because several memory devices are customarily associated with each group, this scheme does not allow selection of individual memory devices because a chip select signal line per device or other impractical solution would be needed.

The above-mentioned and other limitations in current device selection schemes created a need and desire for an improved scheme of selecting a particular memory device or group of devices for calibration or other operations, such as READ and WRITE operations.

SUMMARY OF THE INVENTION

The present invention provides a novel method and associated apparatus for selecting a memory device or a group of memory devices in a memory system using a combination of dedicated bank select signals and encoded chip select signals. The bank select signals permit a memory controller to activate the capture and decode circuitry at groups (banks) of memory devices, and the encoded chip select signals select individual memory devices or groups of memory devices, allowing the selected devices to respond to commands transmitted on the command and address bus. Capture and decode circuitry at banks not receiving the bank select signal are not activated, thus avoiding unnecessary capturing and decoding operations and associated power consumption. Furthermore, the use of encoded chip select signals preserves the ability to address an individual memory device while using a practical number of signal lines.

The above and other features and advantages of the invention are achieved by providing a plurality of bank select signal lines connecting the memory controller of a memory system with a plurality of respective groups, or "banks," of memory devices. All memory devices in the memory system are assigned to at least one bank, and thus each bank select signal line may be used to select one group of memory devices for particular operations, such as calibration or READ and WRITE operations, to be performed only at the memory devices in that group. The bank select signal lines are separate and distinct from the command and address bus and the bidirectional data bus, both of which connect each memory device in the system with the memory controller. In operation, the memory controller transmits a bank select signal using a bank select signal line to a particular bank of memory devices, thus "selecting" that bank. The memory devices in the selected bank are thereby alerted by the bank select signal to activate their capture and decode circuitry connected to the command and address bus. When the memory controller next transmits command and address data on the command and address bus, only the memory devices in the "selected" bank have their capture and command decode circuitry activated and may as a consequence capture and decode the transmitted command and address data.

The invention permits selection of a single memory device through the use of encoded chip (device) select signals transmitted using the command and address bus. Using a combination of bank select signals transmitted on the bank select signal lines and device select signals transmitted on the command and address bus, the memory controller may select one specific device in the system for a particular operation, such as initialization, calibration, decoding command data, or READ and WRITE operations.

Another aspect of the invention permits the memory controller or other system component to assign an identification value to each memory device in the system, for comparison with an ID embedded in the device select signals. The identification value assigned to each memory device is stored in an ID register which may be located at the associated memory device, at the memory controller, at other components in the system, such as a motherboard or motherboard connector, or at a combination of these locations. The identification value may be compared with device select signals to select a single device or a group of devices in the system for a particular operation or set of operations.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

Figure 1:
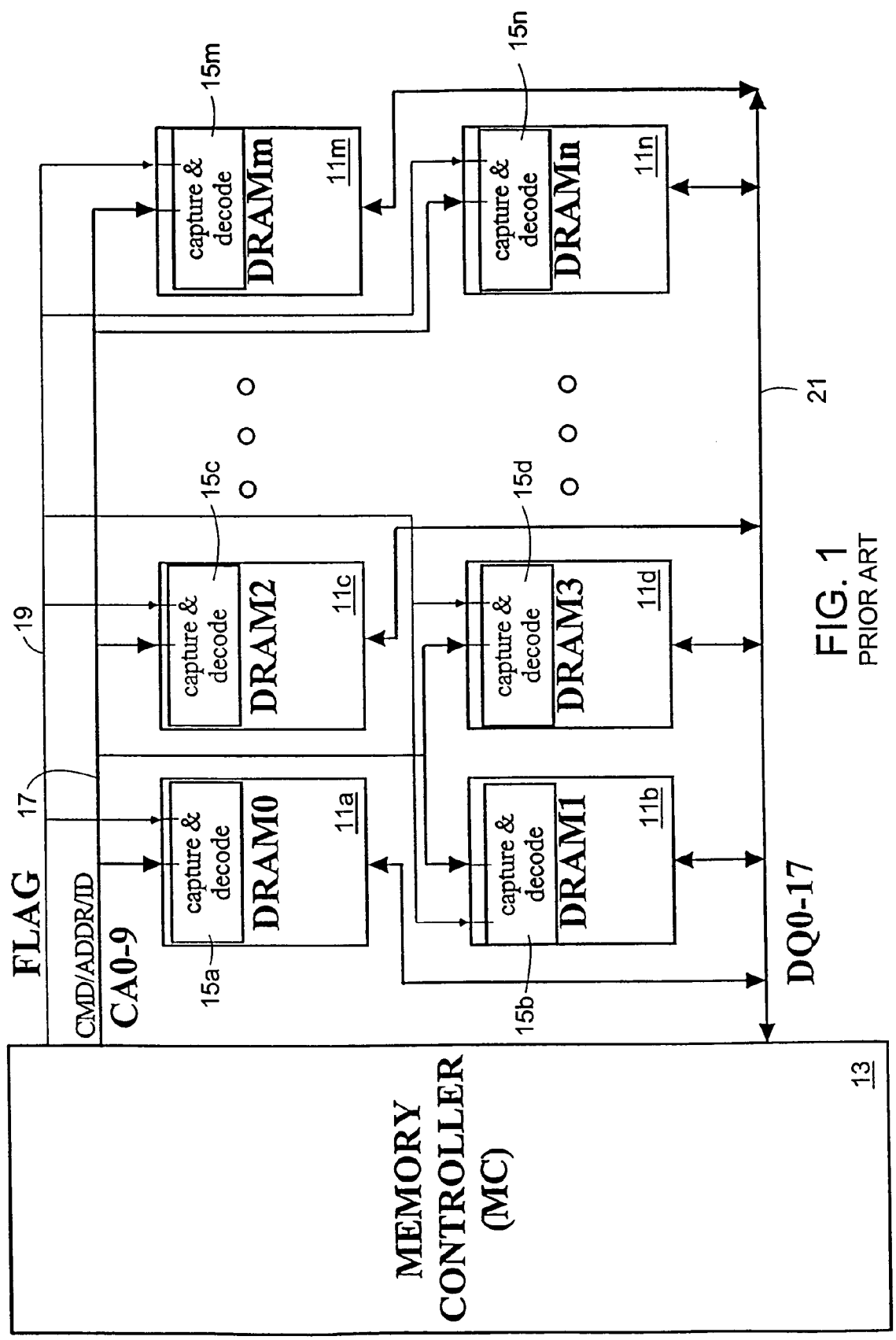
FIG. 1 illustrates a block diagram of an exemplary memory circuit implementing a prior art device selection scheme.

Before describing embodiments of the present invention, two prior art selection schemes will be described to illustrate differences between them and the present invention. Referring to FIG. 1, a block diagram is shown of an exemplary memory circuit that uses a prior art device selection scheme. Memory controller 13 is connected to memory devices 11a–11n (for example, "DRAMs") by a command and address bus 17 (for example, the ten-bit-wide bus CA0-9) and by a bi-directional data bus 21 (for example, the eighteen-bit-wide bus DQ0-17). Also extending between the memory controller 13 and each memory device 11a–11n is a FLAG path 19. Within each memory device 11a–11n is a respective high-speed capture and decode circuit 15a–15n, which receives signals incoming on the command and address bus 17. An exemplary high-speed capture and decode circuit 15a is illustrated in FIG. 2 for memory device 11a.

Figure 2:
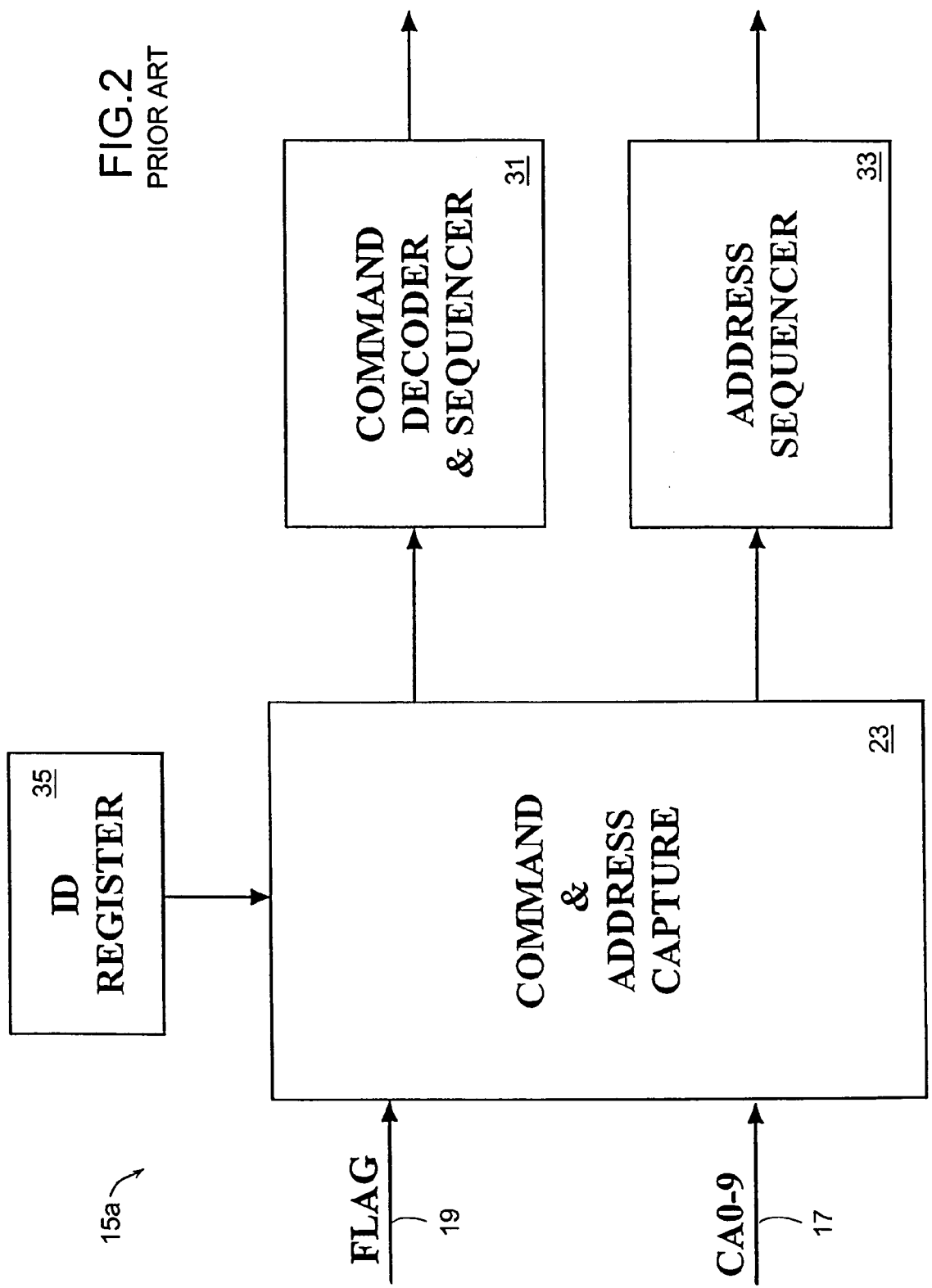
FIG. 2 illustrates a block diagram of a portion of the exemplary memory circuit of FIG. 1.

Referring to FIG. 2, incoming command and address signals are received on command and address bus 17 by the command and address capture circuit 16a. Command and address capture circuit 16a also receives inputs from the FLAG path 19 and an ID register 35. FLAG path 19 normally signals the start of a command during normal operations (e.g. logic "1" for about a half clock cycle) but may transmit a unusual signal (e.g. logic "1" for more than about a half clock cycle) from the memory controller 13 (FIG. 1) commanding a previously-specified particular operation, such as initialization or calibration. ID register 35 stores an identification code associated with the memory device 11a.

Each incoming command and address signal is captured from the command and address bus 17 by high-speed capture circuitry in command and address capture circuit 23 and is parsed into at least command, address, and ID data. If the parsed ID data matches the identification code stored in the ID register 35, then the parsed command is forwarded to the command decoder and sequencer 31 and the parsed address is forwarded to the address sequencer 33. If the parsed ID data does not match the identification code stored in the ID register 35, the command and address capture circuit 23 discards the current command and address signal and awaits the next command and address signal on the command and address bus 17.

Every command and address signal transmitted by the memory controller 13 on the command and address bus 17 is captured and parsed by all command and address capture circuits 23 at respective memory circuits 11a–11n. For commands not addressed to all memory devices 11a–11n, this results in wasted power consumption by memory devices not addressed, due to the decoding of commands irrelevant to those non-addressed memory devices by the high speed capture circuitry contained within them.

Figure 3:
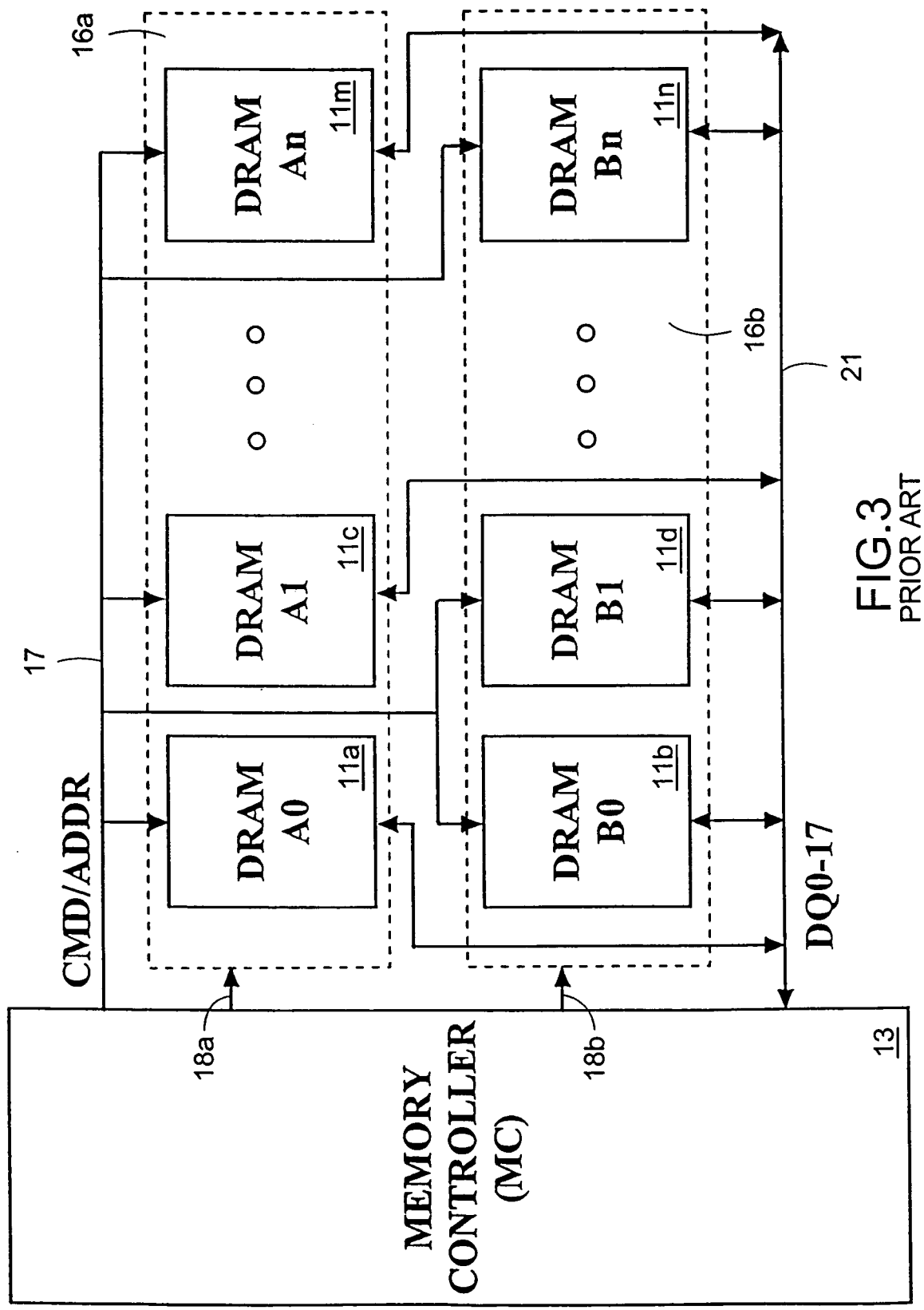
FIG. 3 illustrates a block diagram of an exemplary memory circuit implementing another prior art device selection scheme.

Another prior art device selection scheme is illustrated in FIG. 3. A memory controller 13 is connected to memory devices 11a–11n by command and address bus 17, bi-directional data bus 21, and "device select" lines 18a and 18b. In this scheme, memory devices 11a–11n are physically organized into a plurality of separate groups. For example, FIG. 3 shows memory devices 11a, 11c . . . 11m organized into a single group 16a, and memory devices 11b, 11d . . . 11n are organized into a single group 16b. Device select line 18a connects the memory controller 13 to first group 16a and device select line 18b connects the memory controller 13 to second group 16b.

The device select lines 18a, 18b transmit "device select" signals during operations, such as calibration or READ and WRITE operations, from the memory controller 13 to the groups 16a, 16b. The groups may include memory devices on the same module or on separate modules. Also, each module of memory devices may contain more than one group. The device select signals alert the memory devices in each group which receives a device select signal to respond to a command and address signal concurrently transmitted on the command and address bus 17. Thus, groups of memory devices may be addressed by transmitting device select signals on the device select lines 18a, 18b. However, this scheme is limited in that it does not provide the ability to select a single memory device, since each device select signal activates an entire group, usually composed of several memory devices.

An exemplary embodiment of the invention will now be described with reference to FIGS. 4 and 8. Although the invention will be described using the environment of a DRAM memory system, it should be apparent that the invention may be used in other types of memory systems as well. In contrast to the prior art schemes described above, exemplary embodiments of the present invention substantially decrease unnecessary power consumption and preserve the ability to select individual memory devices.

Figure 4:
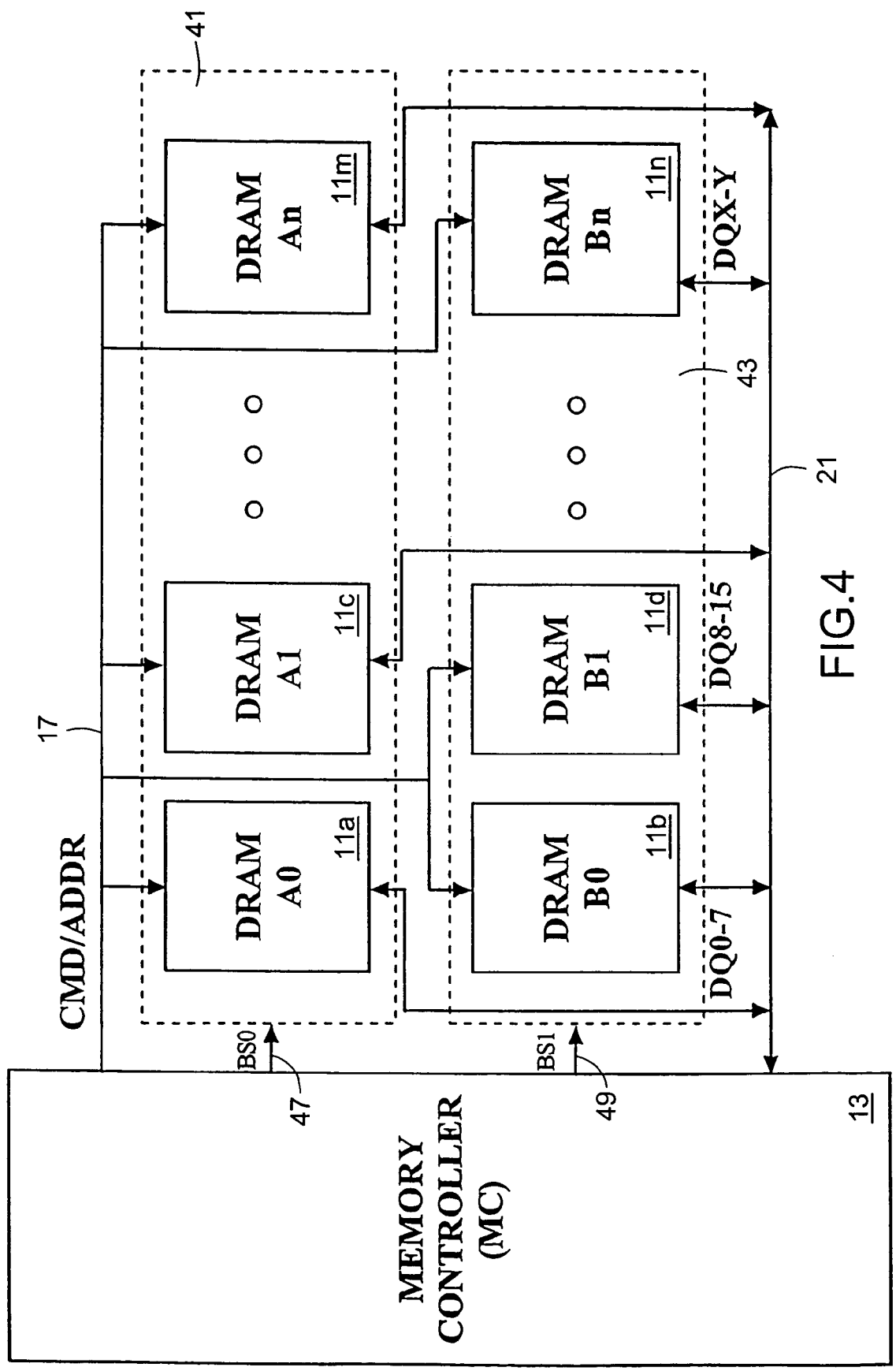
FIG. 4 illustrates a block diagram of an exemplary embodiment of the invention.

Referring to FIG. 4, memory controller 13 is connected to memory devices 11a–11n by command and address bus 17, data bus 21, and by bank select signal paths BS0 47 and BS1 49. Bank select signal paths BS0 47 and BS1 49 connect the memory controller 13 to each of a group of memory devices organized in a "bank." For example, as shown in FIG. 4, memory devices 11a–11n are organized into banks 0 and 1 such that memory devices 11a, 11c ... 11m comprise bank0 41, memory devices 11b, 11d, ... 11n comprise bank1 43. Bank0 41 is connected to memory controller 13 by bank select path BS0 47 and bank1 43 is connected to controller 13 by bank select path BS1 49.

Figure 8:
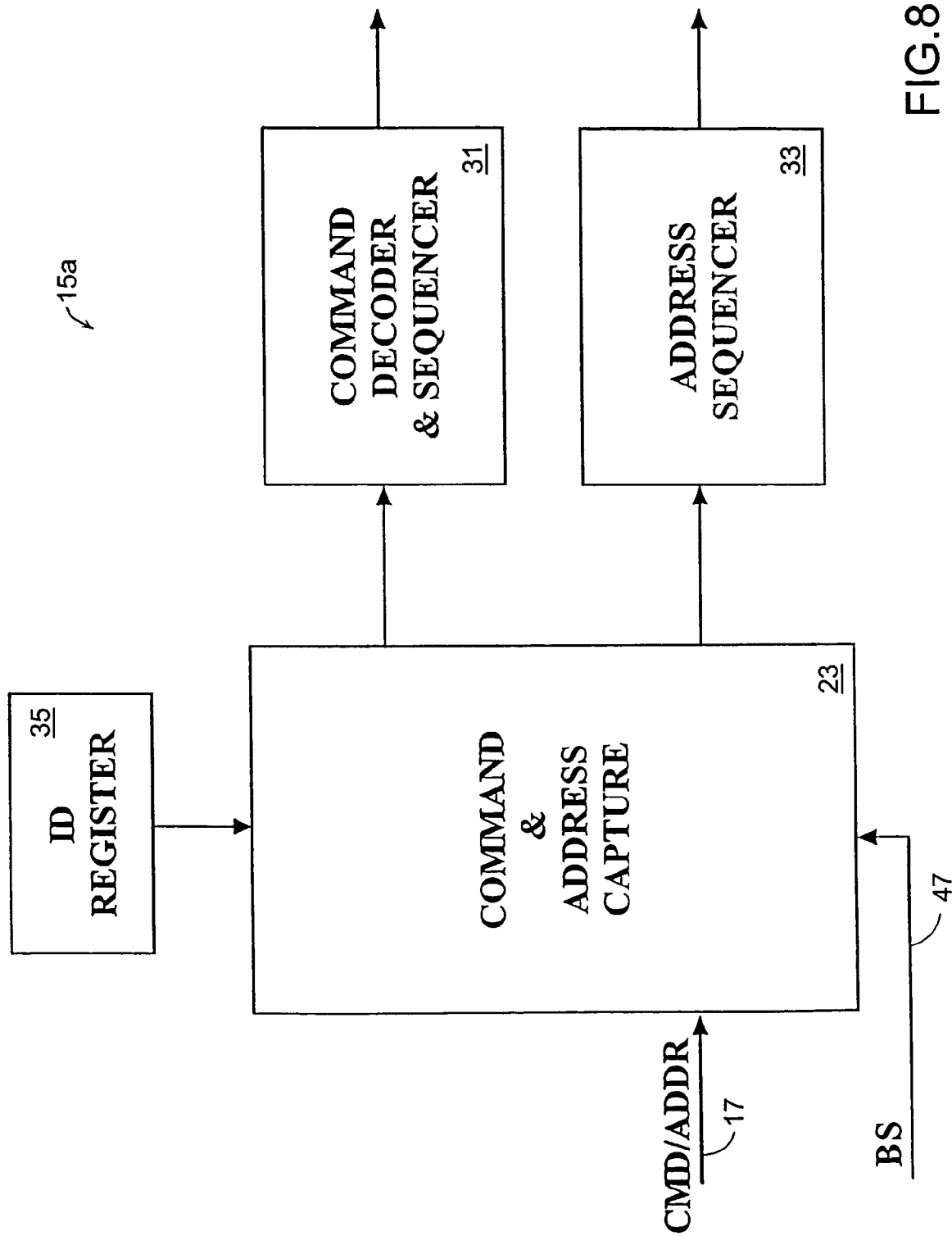
FIG. 8 illustrates a block diagram of a portion of the exemplary embodiment of the invention shown in FIG. 4.

Bank select signals transmitted by the memory controller 13 to an individual bank are passed on to the individual memory devices 11a–11n and used in the high speed capture circuits 15a–15n, an example of which is illustrated in FIG. 8. Referring to FIG. 8, an exemplary high speed capture circuit 15a is shown as contained in, for example, memory device 11a. The capture circuit 15a contains, for example, input buffer amplifiers respectively connected to the lines of the command and address bus 17. These buffer amplifiers are disabled and draw no power until a predetermined bus select signal is present on bus select signal path 47. Command and address signals are made available to command and address capture circuit 23, and the buffer amplifiers, on command and address bus 17. An identification code associated with the memory device 11a is stored in ID register 35 and is accessed by command and address capture circuit 23 when the predetermined bus select signal is present on signal path 47 to compare to incoming device select signals.

In operation, command and address capture circuit 23 does not capture or decode any command and address signals from the command and address bus 17 until a bank select signal is received on bank select path 47. Only when a predetermined bank select signal is received on bank select path 47 are the input buffers of the command and address capture circuit 23 activated to capture a command and address signal from the command and address bus 17. The received signal is then parsed into a command, an identification code (encoded chip select signal) and an address in the command and address capture circuit 23. The identification code (encoded chip select signal) is compared to the value stored in ID register 35. If the comparison shows a predetermined relationship, e.g. a data match between the encoded chip select signal and the ID register value, the parsed command is forwarded to the command decoder and sequencer 31 and the address is forwarded to the address sequencer 33. Alternatively, only the identification code (device select signal) may initially be extracted from the received signal, and only when a predetermined relationship (e.g., a data match) is found to the value stored in ID register 35 is the command and address received, parsed and forwarded to the respective decoders and sequencers.

Therefore, the command and address capture circuit 23 (and its associated high-speed capture circuitry) is not activated until a bank select signal is received and many unnecessary captures are avoided at the memory devices 11a–11n. Consequently, there is no output from decoder 31 which is passed to downstream logic circuits of the memory device. An unnecessary capture will occur only if the memory controller 13 commands an operation involving only one memory device (e.g., 11a) in a bank (e.g., 41) that includes more than one memory device (e.g., 11a, 11b). In that event, unnecessary captures occur only at the other memory device(s) in the bank (e.g. 11b), not at all memory devices 11a–11n in the system. Thus, even when unnecessary captures occur, they are limited to memory devices in the same bank, thereby conserving a substantial amount of valuable circuit power resources.

This exemplary embodiment of FIGS. 4 and 8 permits the memory controller 13 to select individual memory devices for a particular operation through the use of "device select" signals. These device select signals, which may be encoded signals, take the form of the identification code which may be embedded in each command transmitted on the command and address bus 17, or may take the form of separate device select signals. In addition to the bank select signals passed by bank select paths 47, 49, the memory controller 13 may transmit device select signals using command and address bus 17, thus forming a customizable hierarchy of memory devices 11a–11n. Using a combination of bank select signals and device select signals, any combination of the memory devices 11a–11n may be addressed by the memory controller 13. The operation of the memory system may therefore be flexibly configured for operations of the memory circuit, such as initialization, calibration, or READ and WRITE operations. FIG. 8 illustrates the topology of the capture and decode circuitry 15a which, in circuit 23 compares the identification code in the device select signal to the value stored in ID register 35.

Figure 5:
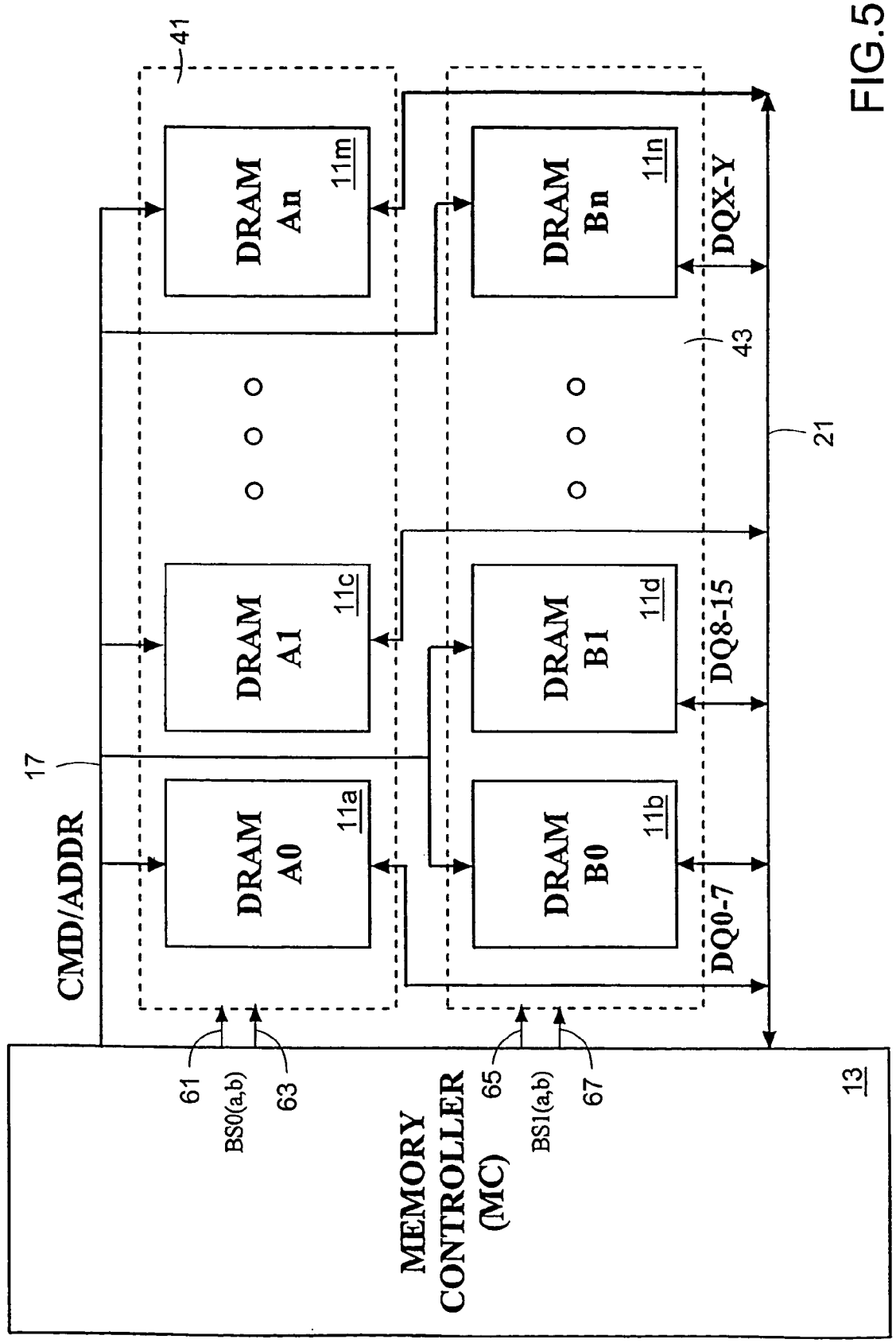
FIG. 5 illustrates a block diagram of an alternate exemplary embodiment of the invention.

An alternate embodiment of the invention is shown in FIG. 5. Each bank select path BS0, BS1 is one logical path, but is physically constructed using more than one physical signal line. For example, bank select path BS0 comprises two physical bank select signal lines BS0(a,b) 61, 63, each intended to carry the same information. One advantage of this embodiment of the invention is that there is less capacitive loading on any single BS signal line. During high-speed operation of the memory system, additional capacitive loading may result in degraded performance, including compromising the signal integrity and/or the timing budget margin of the associated signal. To avoid this problem, this embodiment may utilize two physical signal lines for one logical bank select path. This does not change the fact that a memory device must receive both a BS signal and a device select match in order to be selected. In FIG. 5, bank select path BS0 contains two physical lines 61, 63 and bank select path BS1 contains two physical lines 65, 67. Each path BS0, BS1 may also contain more than two physical lines.

Figure 6:
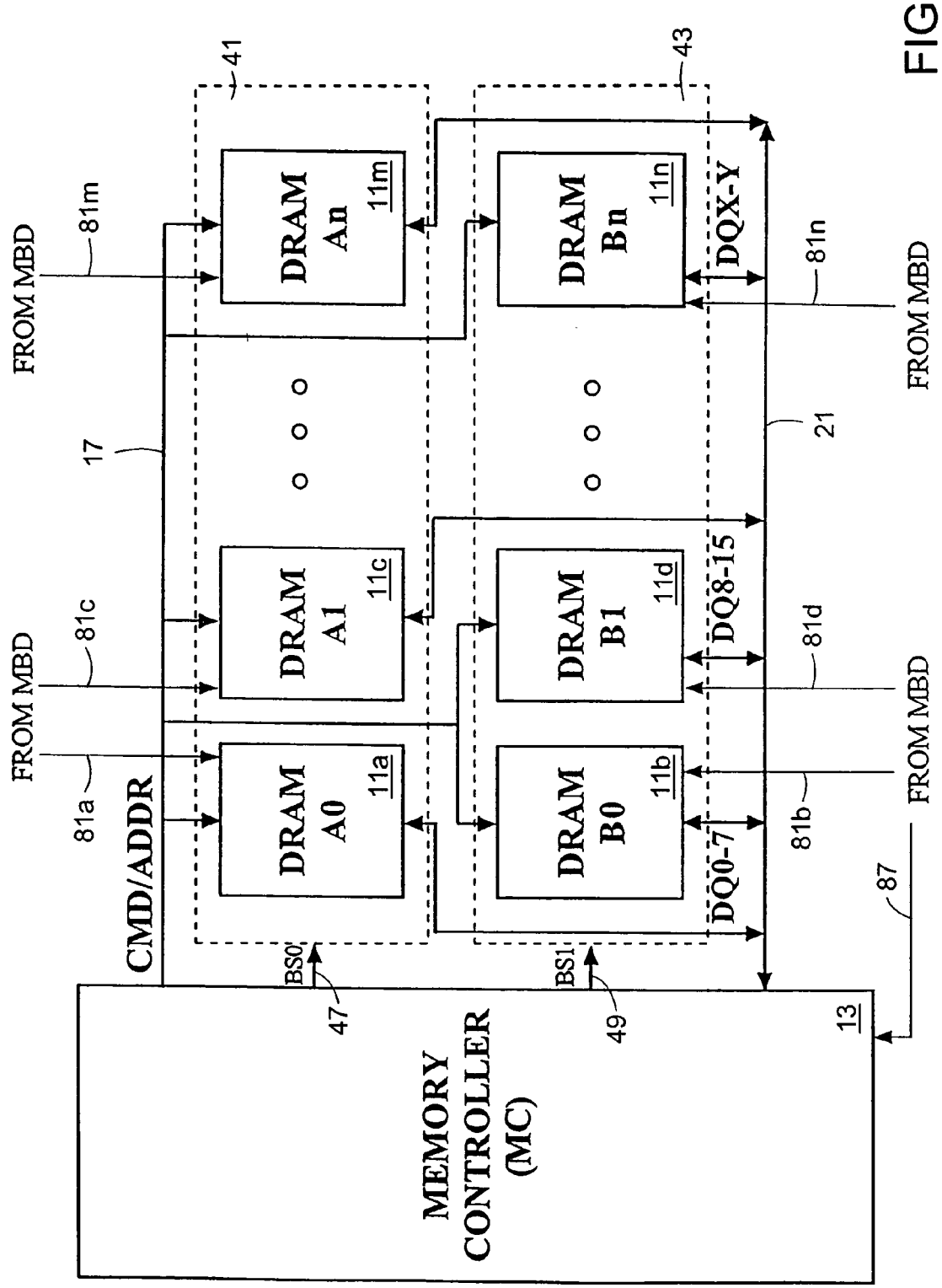
FIG. 6 illustrates a block diagram of another alternate exemplary embodiment of the invention.

Another alternate embodiment of the invention is shown in FIG. 6. In the exemplary embodiment illustrated in FIGS. 4 and 8, the identification code assigned to each memory device 11a–11n was stored in an ID register 35 within the memory device (see FIG. 8). This identification code is accessed and used when a bank select signal is received to determine whether a captured command received on the command and address bus 17 was intended for the associated memory device. In contrast, the alternate embodiment illustrated in FIG. 6 stores each identification code at a location on a motherboard connected to both the memory controller 13 and the memory devices 11a–11n.

Figure 11:
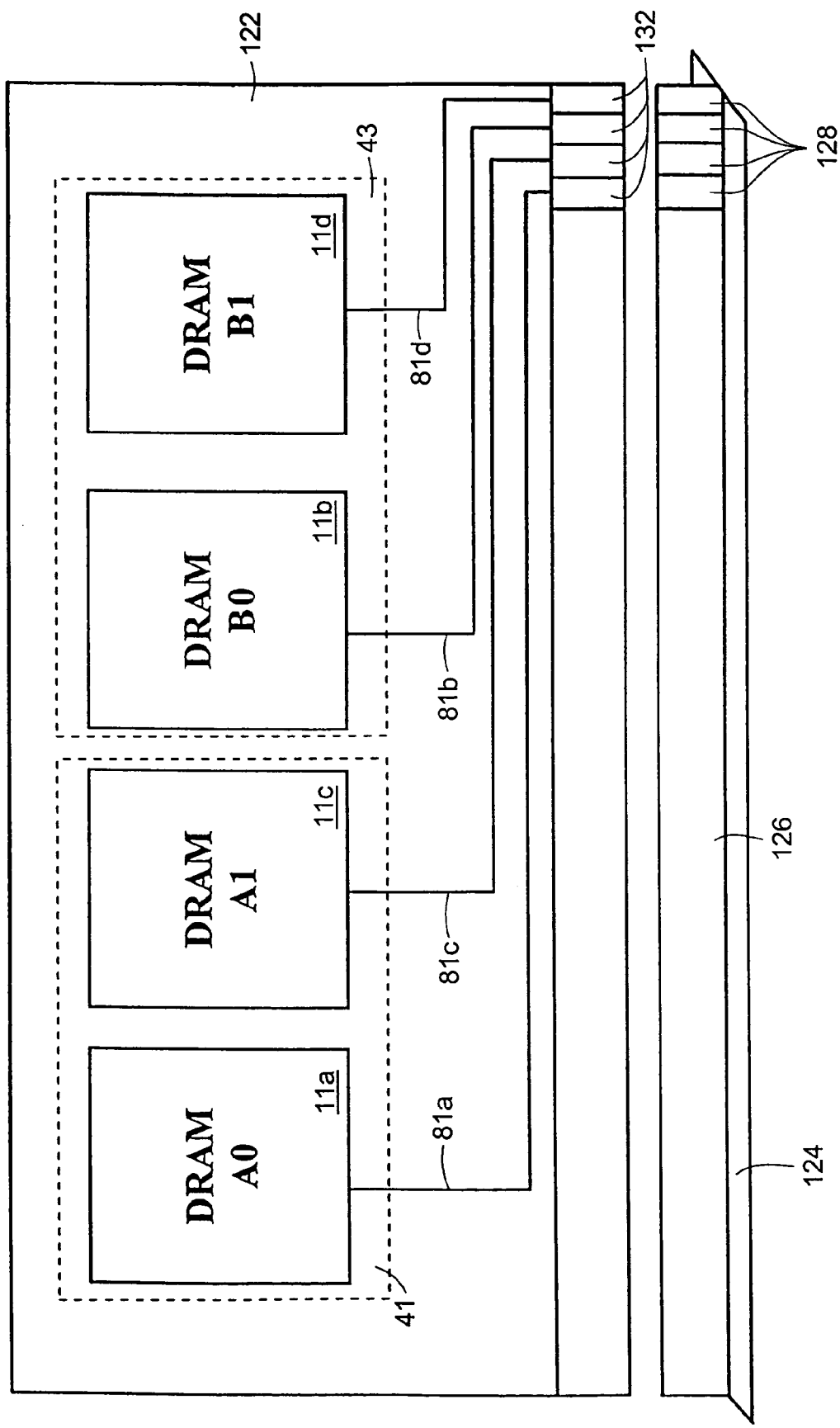
FIG. 11 illustrates a block diagram of a memory module, motherboard and connector for the exemplary embodiment of the invention shown in FIG. 6.

For example, FIG. 11 shows a memory module 122 with connection pins 132 for electrical connection to a connector 126 on a motherboard 124. Corresponding to the connection pins 132 on the memory module, the connector 126 contains static pins 128 for assigning an identification code to each memory device 11a–11d. Identification codes in the static pins 128 are electrically transmitted to the memory devices 11a–11d through the connection pins 132 to ID paths 81a–81d. The static pins 128 may further be programmable by the motherboard for later reconfiguration and for sharing access to memory device identification information with other system components. In this embodiment, the motherboard passes memory device identification information to the memory controller 13 using ID pins on the connection 87 (FIG. 6) between the motherboard 124 and the memory controller 13. In a further embodiment, the motherboard 124 may pass memory device identification information to memory devices or the memory controller 13 using multiplexed signals over dedicated signal lines.

Figure 9:
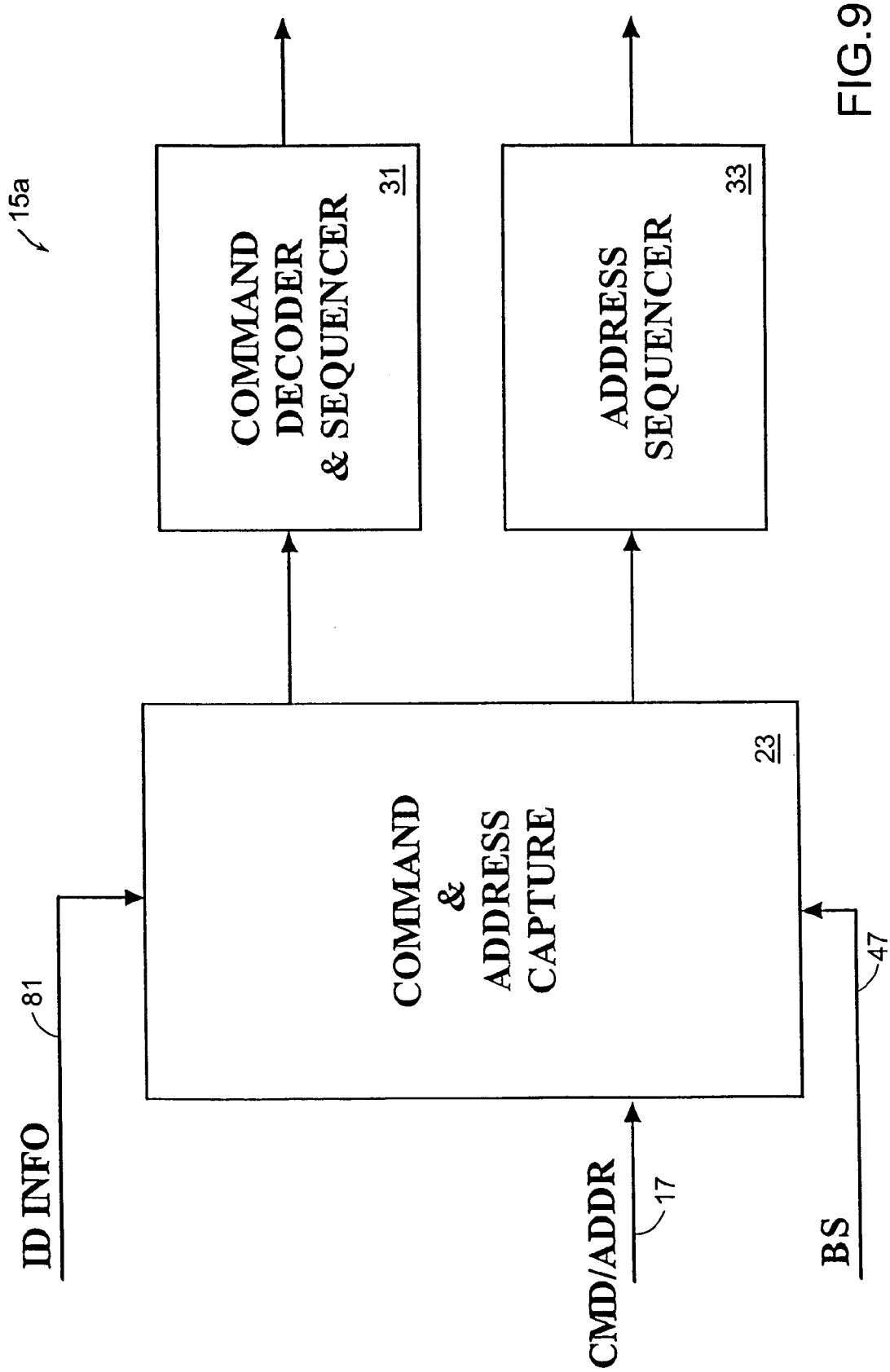
FIG. 9 illustrates a block diagram of a portion of the exemplary embodiments of the invention shown in FIGS. 6 and 7.

FIG. 9 illustrates the topology of an exemplary high-speed capture circuit 15a contained within a memory circuit 11a for the alternate embodiment shown in FIG. 6. Rather than storing the identification code associated with the memory circuit 11a in an ID register 35 (see FIG. 8), the command and address capture circuit 23 accesses the identification code associated with the memory device 11a through ID path 81. In other respects, the high speed capture circuit 15a operates similarly to that of the exemplary embodiment illustrated in FIG. 8.

Figure 7:
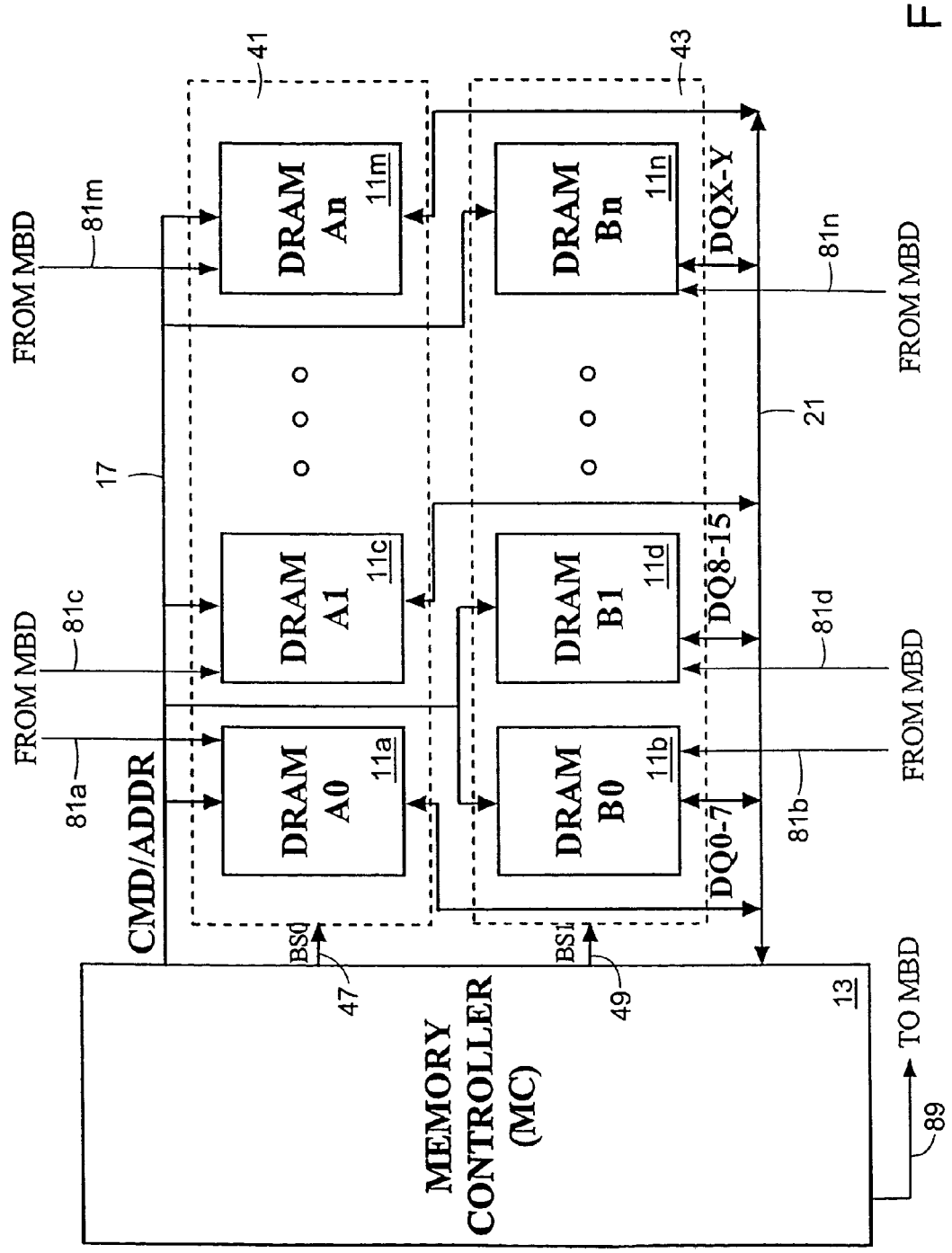
FIG. 7 illustrates a block diagram of another alternate exemplary embodiment of the invention.

In another alternate embodiment illustrated in FIG. 7, identification codes for each memory device 11a–11n are stored at the memory controller 13. Similar to the embodiment illustrated in FIG. 6, the identification codes associated with each memory device 11a–11n are transmitted though a motherboard 124 (FIG. 11) connected to both the memory controller 13 and the memory devices 11a–11n. However, the identification codes are not determined by static pins 128 on the connector 126, but are instead assigned and stored by the memory controller 13. The memory controller 13 may transmit the assigned identification codes to the motherboard 124 using ID path 89, and the motherboard 124 in turn may transmit identification data to memory devices 11a–11n through connection pins 132 and through ID paths 81a–81d. FIG. 9 shows an exemplary topology of the high speed capture circuit 15a for this embodiment, which is identical to that for the embodiment of FIG. 6.

Figure 10:
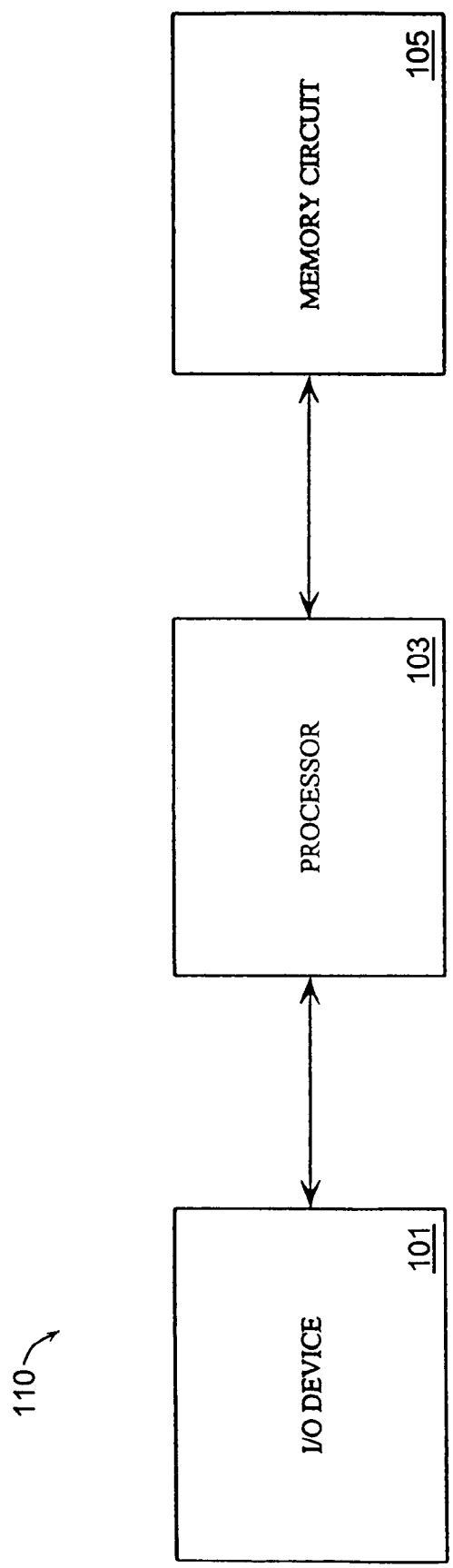
FIG. 10 illustrates a processor system including a memory circuit which employs a device selection method and apparatus in accordance with the invention.

A memory circuit utilizing the device selection scheme and operating as described above may be used in a processor system of the type shown in FIG. 10. The processor system 110 comprises a processor 103, a memory circuit 105, and an I/O (input/output) device 101. The memory circuit 105, for example, a DRAM memory circuit, contains bank select signal lines operating as described in accordance with the present invention. In addition, the processor 103 may itself be an integrated processor which utilizes on chip memory devices containing the bank select signal lines and associated circuitry of the present invention.

The method and apparatus of the above-described invention may be used to improve the performance of a memory system by the selection of individual memory devices by a memory controller for operations involving only that memory device, such as for initialization, calibration and READ and WRITE operations.

While the invention has been described in detail in connection with the exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A memory device comprising:
   a control logic circuit;
   at least one bank select input signal path;
   at least one input signal path for receiving command data and chip select data, said input signal path including input buffers which are selectively enabled by a predetermined signal on said bank select input path;
   a decoder for decoding command data passed by said buffers;
   a comparison circuit for comparing device select data passed by said buffers with predetermined identification data and for passing decoded command data from said decoder to said control logic circuit when a predetermined relationship exists between said device select data and predetermined identification data, wherein said identification data is received by said memory device from an ID storage unit via an identification path coupled between said ID storage unit and said memory device.

2. The memory device of claim 1 wherein each bank select input signal path includes one physical signal line capable of receiving a bank select input signal.

3. The memory device of claim 1 wherein each bank select input signal path includes more than one physical signal line, each of said physical signal lines being capable of receiving a bank select input signal.

4. The memory device of claim 2 wherein said predetermined relationship is a match of said device select data with said identification data.

5. The memory device of claim 1 further comprising a connector between said memory device and a motherboard, wherein said ID storage unit is provided at said connector.

6. The memory device of claim 5 wherein said ID storage unit comprises static ID pins on said connector adapted to receive a coded signal.

7. The memory device of claim 6 wherein said coded signal at said static ID pins is programmable by said motherboard.

8. The memory device of claim 1 wherein said one identification path is at least one hardwired connection on a memory module which includes said memory device.

9. A memory device comprising:
   a capture and decode portion, said capture and decode portion comprising:
   a command and address capture circuit having at least one input buffer coupled to a first input and at least one bank select input;
   a command and address bus coupled to said at least one input buffer; wherein
   said command and address capture circuit is configured to activate said at least one input buffer to receive a command and address signal from said command and address bus only when a predetermined bank select signal is received on said bank select input.

10. The memory device of claim 9 further comprising:
a command decoder and sequencer coupled to a first output of said command and address capture circuit; and
an address sequencer coupled to a second output of said command and address capture circuit, wherein said command and address capture circuit is configured to forward a command portion of said command and address signal to said command decoder and sequencer, and to forward an address portion of said command and address signal to said address sequencer only when an identification portion of said command and address signal has a predetermined relationship with an identification value of said memory device.

* * * * *